United States Patent
Fukushima (10) Patent No.: US 8,305,850 B2
(45) Date of Patent: Nov. 6, 2012

(54) METHOD OF EVALUATING MAGNETIC RECORDING MEDIUM AND METHOD OF MANUFACTURING MAGNETIC RECORDING MEDIUM

(75) Inventor: Masato Fukushima, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/991,189

(22) PCT Filed: May 20, 2009

(86) PCT No.: PCT/JP2009/059258
§ 371 (c)(1),
(2), (4) Date: Nov. 5, 2010

(87) PCT Pub. No.: WO2009/142234
PCT Pub. Date: Nov. 26, 2009

(65) Prior Publication Data
US 2011/0058461 A1   Mar. 10, 2011

(30) Foreign Application Priority Data
May 21, 2008   (JP) .................................. 2008-133198

(51) Int. Cl.
*G11B 21/08*   (2006.01)
(52) U.S. Cl. .................................................. 369/30.03
(58) Field of Classification Search .................. None
See application file for complete search history.

(56) References Cited

U.S. PATENT DOCUMENTS

| | | | |
|---|---|---|---|
| 5,810,477 A | 9/1998 | Abraham et al. | |
| 6,191,902 B1 * | 2/2001 | Hashimura et al. | 360/46 |
| 6,580,572 B1 * | 6/2003 | Yao et al. | 360/25 |
| 7,009,391 B2 | 3/2006 | Lee et al. | |
| 2006/0012904 A1 * | 1/2006 | Naruse et al. | 360/48 |
| 2006/0012913 A1 * | 1/2006 | Nakamura et al. | 360/77.02 |
| 2007/0008639 A1 * | 1/2007 | Tagami et al. | 360/48 |
| 2007/0053108 A1 * | 3/2007 | Sato et al. | 360/240 |

(Continued)

FOREIGN PATENT DOCUMENTS
JP     05-205257 A     8/1993
(Continued)

OTHER PUBLICATIONS

Taiwanese Office Action dated Aug. 27, 2012 for corresponding Taiwanese Patent Application No. 098116465.

*Primary Examiner* — Joseph Feild
*Assistant Examiner* — Henok Heyi
(74) *Attorney, Agent, or Firm* — Sughrue Mion, PLLC (57) ABSTRACT

Disclosed is a magnetic recording medium evaluating method capable of providing a discrete-type or bit-pattern-type magnetic recording medium that has stable head floating characteristics even when concave and convex portions remain on the surface and can respond to high recording density with high productivity. A method of evaluating a magnetic recording medium having a magnetic recording pattern on at least one surface of a disk-shaped substrate and includes concave and convex portions corresponding to the magnetic recording pattern on the surface includes: floating and moving a head slider having a sensor attached thereto above the surface of the magnetic recording medium that is rotated; detecting a signal output from the sensor in a non-contact state between the head slider and the magnetic recording medium; and determining whether the magnetic recording medium is defective on the basis of the signal.

5 Claims, 6 Drawing Sheets

U.S. PATENT DOCUMENTS

| | | | |
|---|---|---|---|
| 2007/0087228 A1* | 4/2007 | Ishiyama | 428/833.3 |
| 2007/0146920 A1* | 6/2007 | Kitamura et al. | 360/53 |
| 2008/0239906 A1* | 10/2008 | Akagi et al. | 369/53.17 |
| 2009/0268595 A1* | 10/2009 | Fukuzawa et al. | 369/275.3 |

FOREIGN PATENT DOCUMENTS

| | | |
|---|---|---|
| JP | 07-296379 A | 11/1995 |
| JP | 10-105908 A | 4/1998 |
| JP | 2003-257016 A | 9/2003 |
| JP | 2004-164692 A | 6/2004 |
| JP | 2004-178793 A | 6/2004 |
| JP | 2004-178794 A | 6/2004 |
| JP | 2004-265474 A | 9/2004 |
| JP | 2007-004919 A | 1/2007 |

* cited by examiner

METHOD OF EVALUATING MAGNETIC RECORDING MEDIUM AND METHOD OF MANUFACTURING MAGNETIC RECORDING MEDIUM

TECHNICAL FIELD

The present invention relates to a method of manufacturing a magnetic recording medium used for, for example, a hard disk device, and more particularly, to a surface inspection process in the manufacturing of a magnetic recording medium.

Priority is claimed on Japanese Patent Application No. 2008-133198, filed May 21, 2008, the content of which is incorporated herein by reference.

BACKGROUND ART

In recent years, the range of applications for magnetic recording devices, such as a magnetic disk device, a flexible disk device, and a magnetic tape device, has widened significantly and the importance thereof has also increased. In addition, the recording density of the magnetic recording media used for these devices has increased significantly. In particular, with the introduction of an MR head and a PRML technique, the surface recording density has increased sharply. In addition, in recent years, with the introduction of, for example, a GMR head and a TMR head, the surface recording density has increased at a rate of about 100% per year. There is a demand for magnetic recording media with a higher recording density. In order to meet the demand, it is necessary to achieve an increase in the coercivity of the magnetic layer, a high signal-to-noise ratio (SNR), and a high resolution. In addition, in recent years, there is an attempt to increase the surface recording density with an increase in the line recording density and in the track density.

The latest magnetic recording device has a maximum track density of 110 kTPI. However, when the track density is increased, the magnetic recording information items of adjacent tracks interfere with each other, and a magnetization transition region, which is a boundary region between adjacent tracks, serves as a noise source, which causes a reduction in SNR. The reduction in SNR leads to a reduction in a bit error rate, which is an obstacle to the improvement of the recording density. In order to increase the surface recording density, it is necessary to reduce the size of each recording bit on the magnetic recording medium and ensure the largest possible saturation magnetization for each recording bit and the largest possible thickness of a magnetic film. However, when the size of the recording bit is reduced, the minimum volume of magnetization per bit is reduced, and recording data may be lost due to magnetization reversal caused by heat fluctuation.

Since the distance between the tracks is short, the magnetic recording device requires a very accurate track servo technique, and a method is generally used which performs recording over a wide range and performs reproduction in a range narrower than that when recording is performed in order to minimize the influence of adjacent tracks. In this method, it is possible to minimize the influence of adjacent tracks, but it is difficult to obtain an adequate reproduction output. Therefore, it is difficult to ensure a sufficient SNR.

As one of the methods for solving the problem of the heat fluctuation and ensuring an adequate SNR or an adequate output, there is an attempt to form concave and convex portions on the surface of a recording medium along the tracks to physically or magnetically separate the recording tracks, thereby improving the track density. This technique is called a discrete track method and a magnetic recording medium manufactured by the method is called a discrete track medium in the following description.

As an example of the discrete track medium, a magnetic recording medium has been known which is formed on a disk-shaped substrate having an uneven pattern formed on the surface thereof, thereby forming magnetic recording tracks and servo signal patterns that are physically separated (for example, see Patent Document 1).

In order to manufacture the discrete track medium, any of the following methods are used: a method of forming a continuous magnetic recording layer including a predetermined number of thin films and physically processing the magnetic recording layer to form tracks; and a method of forming an uneven pattern on the surface of a substrate in advance and forming a thin film of a magnetic recording medium (for example, see Patent Documents 2 and 3). Of the two methods, the former is often called a magnetic layer processing type. The latter is often called an embossing type.

In addition, a method has been proposed which injects nitrogen ions or oxygen ions into a previously formed magnetic layer or emits a laser beam to the magnetic layer, thereby forming a region between the magnetic tracks of the discrete track medium (see Patent Document 4).

There are a glide inspection process and a certified inspection process as a total inspection process for the magnetic recording medium manufactured by the above-mentioned method.

The glide inspection process examines whether there is a protrusion on the surface of the magnetic recording medium. That is, during the recording or reproduction of the magnetic recording medium by the magnetic head, when there is a protrusion with a height equal to or greater than the gap between the medium and the magnetic head on the surface of the medium, the magnetic head collides with the protrusion and is damaged, which causes a defect in the medium. This process examines whether there is a high protrusion (for example, see Patent Document 5). This process examines the presence of a protrusion on the surface of the magnetic recording medium and does not record or reproduce signals on or from the magnetic recording medium.

The certified inspection process is performed on the magnetic recording medium which has passed the glide inspection process. The certified inspection process records a predetermined signal on the magnetic recording medium using the magnetic head as in a general recording/reproducing process of the hard disk drive, reproduces the signal, and checks the quality of the medium, such as electrical characteristics or defects, from the obtained reproduced signal (for example, see Patent Document 6).

[Patent Document 1] JP-A-2004-164692
[Patent Document 2] JP-A-2004-178793
[Patent Document 3] JP-A-2004-178794
[Patent Document 4] JP-A-5-205257
[Patent Document 5] JP-A-10-105908
[Patent Document 6] JP-A-2003-257016

DISCLOSURE OF INVENTION

Technical Problem

During manufacturing of a discrete-type or bit-pattern-type magnetic recording medium, in general, after a magnetic layer having concave and convex portions on the surface thereof is formed, a non-magnetic material is filled in the concave portions to planarize the surface of the magnetic recording medium. In contrast, when a method is used which forms a mask layer corresponding to a magnetic recording pattern on the surface of a magnetic layer, partially demagnetizes the magnetic layer using, for example, ion injection, and forms the magnetic recording pattern in the magnetic layer, the surface of the magnetic recording medium is planarized without filling with a non-magnetic material.

In contrast to the manufacturing method, the inventors have developed a method which provides a mask layer corresponding to a magnetic recording pattern on the surface of a magnetic layer and generates the chemical reaction between the surface and, for example, oxygen gas to partially demagnetize the magnetic layer. It has been found that, in this method, when the surface of the magnetic layer in a reaction region is slightly removed, the reactivity between the oxygen gas and the magnetic layer increases. Slightly concave and convex portions corresponding to the magnetic recording pattern are formed in the surface of the magnetic recording medium obtained by this manufacturing method. It is preferable to fill the concave portions with a non-magnetic material to planarize the concave and convex portions.

However, the planarizing process of filling the non-magnetic material is likely to contaminate the surface of the magnetic recording medium, and the manufacturing process becomes complicated. As a result, the manufacturing costs of the magnetic recording medium increase.

An object of the invention is to provide a method of manufacturing a discrete-type or bit-pattern-type magnetic recording medium that has stable head floating characteristics even when concave and convex portions remain on the surface and that can respond to high recording density with high productivity.

Technical Solution

The inventors conducted a study on a technique capable of solving the problem of a magnetic head being damaged even though a magnetic recording medium that had concave and convex portions remaining slightly on the surface thereof and that was used in a hard disk drive which had passed a general glide inspection process or a certified inspection process. As a result, the inventors found that, when the magnetic head floated on a magnetic recording pattern portion of the magnetic recording medium, the magnetic head vibrated at the boundary between a data region and a servo information region and the magnetic head instantaneously came into contact with the magnetic recording medium and was damaged due to the vibration. In addition, the inventors analyzed the vibration of the magnetic head at the boundary between the data region and the servo information region in detail. The analysis result proved that the magnitude of the vibration was proportional to a small unevenness of the formation of the pattern of the magnetic recording medium. Therefore, the inventors found that, when the magnetic recording medium with a vibration equal to or greater than a predetermined value was determined to be defective and was excluded, it was possible to manufacture a magnetic recording medium with a low failure rate when it was driven by a hard disk drive. The invention was completed on the basis of these findings. That is, the invention relates to the following.

According to a first aspect of the invention, there is provided a method of evaluating a magnetic recording medium having a magnetic recording pattern on at least one surface of a disk-shaped substrate and includes concave and convex portions corresponding to the magnetic recording pattern on the surface. The method includes: floating and moving a head slider having a sensor attached thereto above the surface of the magnetic recording medium that is rotated; detecting a signal output from the sensor in a non-contact state between the head slider and the magnetic recording medium; and determining whether the magnetic recording medium is defective on the basis of the signal. The signal output from the sensor in the non-contact state between the head slider and the magnetic recording medium is caused by the concave and convex portions corresponding to the magnetic recording pattern.

According to a second aspect of the invention, in the method of evaluating a magnetic recording medium according to the first aspect, the signal output from the sensor in the non-contact state between the head slider and the magnetic recording medium may be caused by the instability of the floating of the head slider.

According to a third aspect of the invention, in the method of evaluating a magnetic recording medium according to the first or second aspect, the sensor attached to the head slider may be a piezoelectric sensor, and the detected signal may be caused by the vibration of the head slider.

According to a fourth aspect of the invention, in the method of evaluating a magnetic recording medium according to any one of the first to third aspects, the magnetic recording pattern may include a data region and a servo information region, and the signal output from the sensor in the non-contact state between the head slider and the magnetic recording medium may be output when the head slider passes through a boundary portion between the data region and the servo information region of the magnetic recording pattern.

According to a fifth aspect of the invention, there is provided a method of manufacturing a magnetic recording medium having a magnetic recording pattern on at least one surface of a disk-shaped substrate and includes concave and convex portions corresponding to the magnetic recording pattern on the surface. The method includes the evaluation method according to any one of the first to fourth aspects as a step of inspecting the magnetic recording medium.

According to a sixth aspect of the invention, in the method of manufacturing a magnetic recording medium according to the fifth aspect, the step of inspecting the magnetic recording medium may include a glide inspection evaluation.

ADVANTAGEOUS EFFECTS

According to the invention, it is possible to stabilize the floating characteristics of a magnetic head from a discrete-type or bit-pattern-type magnetic recording medium having concave and convex portions remaining on the surface thereof. In addition, it is possible to reduce the amount of floating of the magnetic head without any contact between the magnetic head and the magnetic recording medium. Therefore, it is possible to provide a hard disk drive with a low failure rate and high recording density with high productivity.

BEST MODE FOR CARRYING OUT THE INVENTION

The invention relates to a method of evaluating a magnetic recording medium having a magnetic recording pattern on at least one surface of a disk-shaped substrate and includes concave and convex portions corresponding to the magnetic recording pattern on the surface. The method includes: floating and moving a head slider having a sensor attached thereto above the surface of the magnetic recording medium that is rotated; detecting a signal output from the sensor in a non-contact state between the head slider and the magnetic recording medium; and determining whether the magnetic recording medium is defective on the basis of the signal.

First, a magnetic recording medium according to the invention will be described.

The magnetic recording medium according to the invention includes magnetic recording patterns that are magnetically separated on a disk-shaped substrate.

In general, the magnetic recording pattern includes a data region and a servo information region. Concave portions as separation regions and convex portions as magnetic recording regions are formed on the surface of the magnetic recording medium. Convex magnetic recording patterns are separated by the concave portions, and convex and concave portions remain on the surface of the magnetic recording medium.

The magnetic recording medium according to the invention can be applied to both a discrete-type magnetic recording medium and a bit-pattern-type magnetic recording medium. However, the discrete-type magnetic recording medium will be described in detail as an example.

Figure 1:
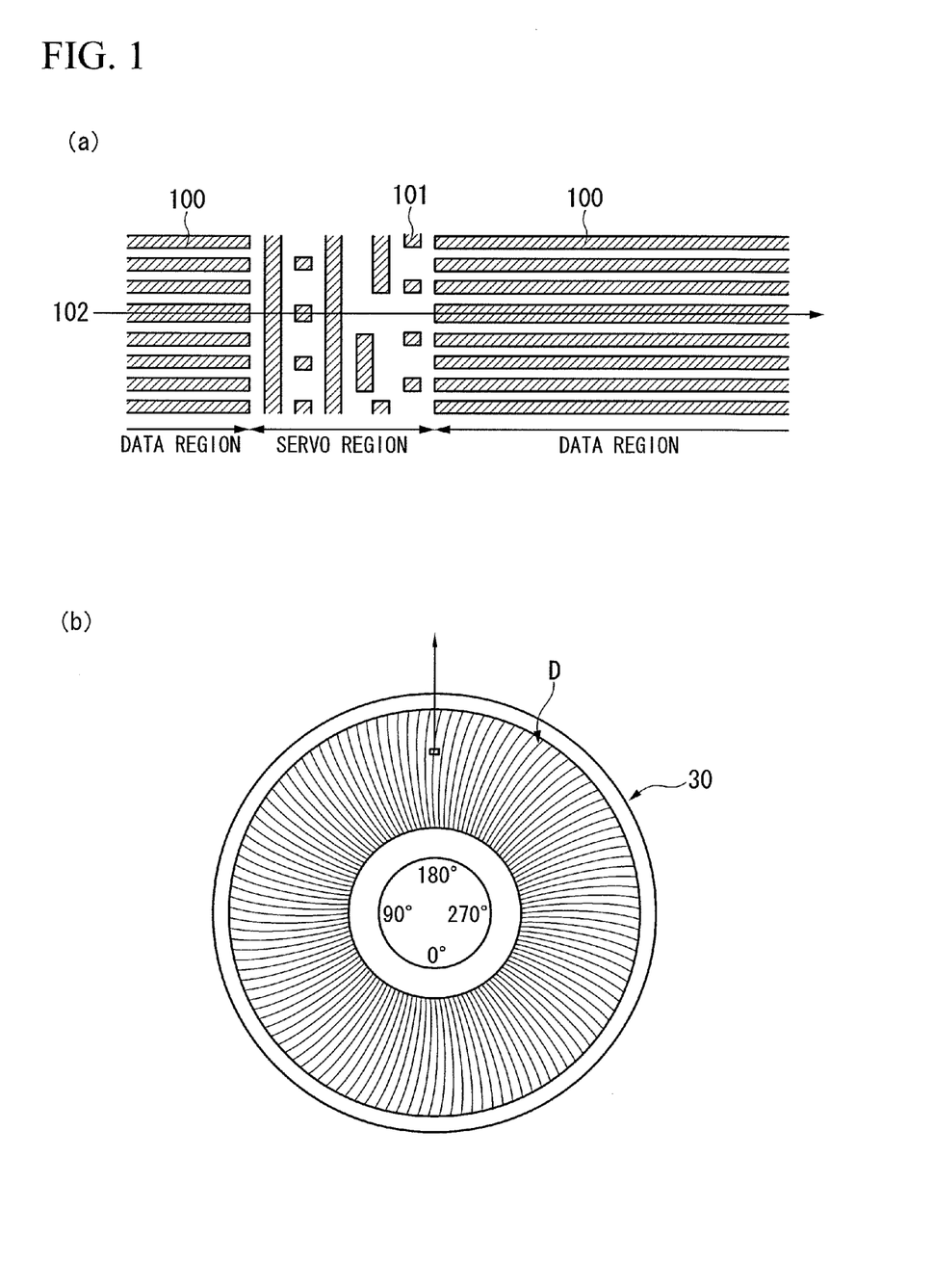
FIG. 1 is a diagram illustrating the pattern of a servo information region and a data region of a magnetic recording medium according to the invention.

FIG. 1 shows an example of a servo information pattern 101 and a data region pattern 100 in a servo information region (servo region) and a data region of a magnetic recording medium 30, which is an example of a discrete track medium. FIG. 1(b) is a diagram schematically illustrating the surface of the magnetic recording medium 30, and FIG. 1(a) is a partial enlarged view of FIG. 1(b). A radial line D shown in FIG. 1(b) corresponds to the servo region, and a region between the lines D corresponds to the data region. An arrow 102 shown in FIG. 1 indicates the movement position and direction of a head slider (magnetic head) on the surface of the magnetic recording medium 30.

There is a plurality of data recording regions (in some cases, simply referred to as data regions) on the surface of the magnetic recording medium 30. The positions of the data recording regions are determined by track information and sector information. First, a magnetic head that moves on the surface of the magnetic recording medium 30 reads the track information and sector information of a corresponding data region in the servo information region, finely adjusts a track position in a burst pattern region, and reads and writes the information in the data region.

The track information and the sector information are recorded as digital information in the servo information region by the magnetic recording pattern 101 shown in FIG. 1. In addition, the magnetic recording patterns 100 separated by the tracks are formed in the data region. The magnetic recording patterns are formed by the neighboring separation regions.

In the invention, the separation region forming the magnetic recording pattern of the magnetic recording medium 30 forms a concave portion in the surface of the magnetic recording medium 30. The concave portion makes the floating of the magnetic head from the surface of the magnetic recording medium 30 unstable. In particular, the concave and convex portions of the magnetic recording pattern 101 in the servo information region are irregular, but the concave and convex portions of the magnetic recording pattern 100 in the data region are regular. That is, when the magnetic head is moved from the servo information region to the data region and from the data region to the servo information region, the floating of the head is unstable. For example, the reason is that, when the area ratio of the convex portion forming the magnetic layer is high, the head slider receives high wind pressure, which results in an increase in the amount of floating.

Figure 2:
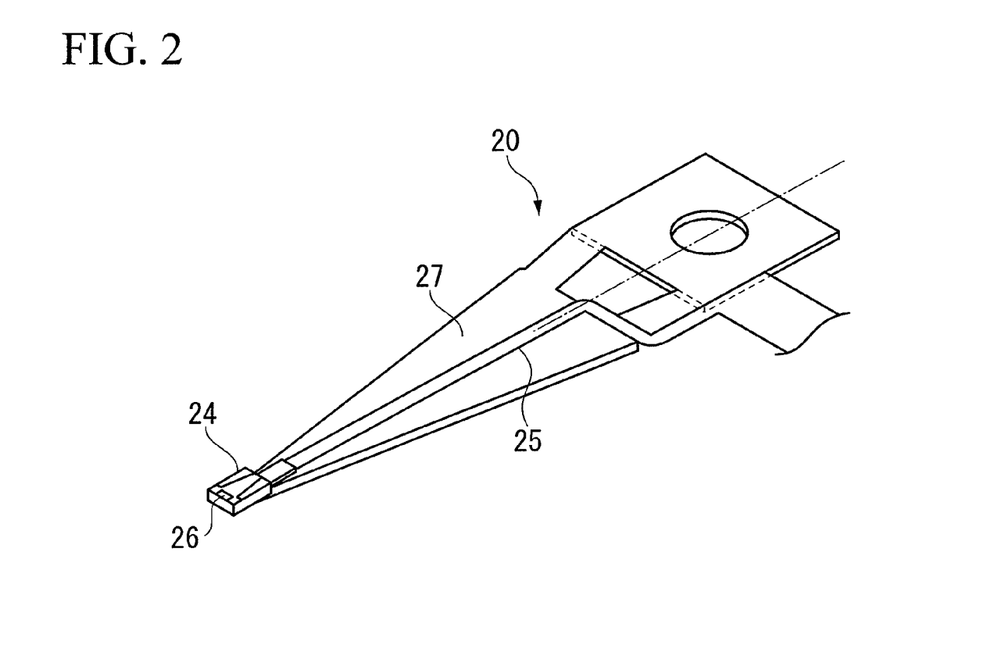
FIG. 2 is a perspective view schematically illustrating a head gimbal assembly used in a magnetic recording/reproducing apparatus.
Figure 3:
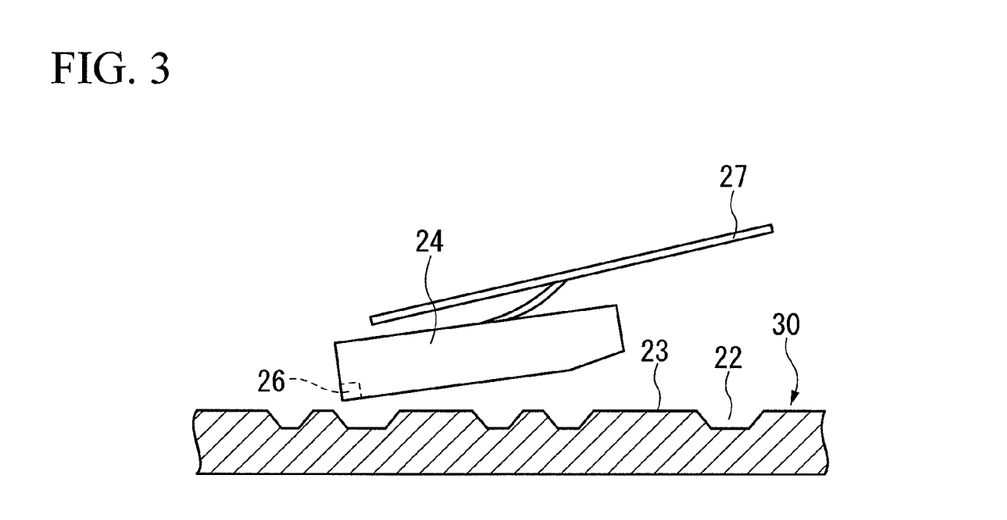
FIG. 3 is a cross-sectional view schematically illustrating the floating of a head slider on the magnetic recording medium.

FIG. 2 is a diagram schematically illustrating a head gimbal assembly having the magnetic head attached thereto. A head gimbal assembly 20 includes a suspension arm 27, which is a thin metal plate, a head slider 24 that is provided at the leading end of the suspension arm 27, a magnetic head 26 that is provided on the head slider 24, and a control unit (not shown) that is electrically connected by a signal line 25.

The magnetic head 26 is arranged close to the magnetic recording medium 30 on the trading side that is opposite to the leading side where the inclined plane of the head slider 24 is formed. As the magnetic head 26, for example, the following head may be used: a head that includes as a reproducing element a TMR element using a tunnel-type magneto-resistive (TMR) effect as well as an MR (magneto-resistive) element using a giant magneto-resistive (GMR) effect and is suitable for high recording density. In addition, the use of the TMR element makes it possible to increase the recording density.

As described above, the concave and convex portions of the magnetic recording pattern 101 in the servo information region are irregular, but the concave and convex portions of the magnetic recording pattern 100 in the data region are regular. That is, when the magnetic head 26 is moved from the servo information region to the data region and from the data region to the servo information region, the floating of the magnetic head 26 is unstable. It is possible to reduce the instability a little by optimizing the magnetic recording patterns 100 and 101 in the data region and the servo information region. However, the inventors' examination proved that, even when the magnetic recording patterns 100 and 101 in the data region and the servo information region were optimized, a little difference in the height of an uneven pattern and a difference in the height of, particularly, the edge of the uneven pattern occurred due to small differences in the pattern formation conditions in the manufacturing process of the magnetic recording medium 30, and it was difficult to completely remove the instability, particularly, it was difficult to prevent instantaneous vibration when the magnetic head 26 was moved from the data region to the servo information region. Therefore, when there was a large error in the formation of the magnetic recording patterns 100 and 101 during the movement of the magnetic head 26 from the data region to the servo information region, the magnetic head 26 instantaneously comes into contact with the magnetic recording medium 30.

In addition, the inventors analyzed in detail the vibration of the magnetic head 26 at the boundary between the data region and the servo information region. The analysis result proved that the level of the vibration was proportional to a small unevenness in the pattern formation conditions of the magnetic recording medium 30 and the magnetic recording medium 30 with a vibration level equal to or more than a predetermined value was determined to be defective and was then excluded, which made it possible to manufacture the magnetic recording medium 30 with a low failure rate when it was driven by a hard disk drive.

In the invention, the magnetic recording medium 30 is rotated, and the head slider with a sensor attached thereto floats and moves above the surface of the magnetic recording medium 30. A signal output from the sensor is detected in a non-contact state between the head slider and the magnetic recording medium 30, and it is determined whether there is a defect in the magnetic recording medium 30 on the basis of the signal. The head slider used in the invention includes, for example, the head slider 24 and the suspension arm 27 shown in FIG. 2, and the sensor is attached to the head slider 24 or the suspension arm 27 provided in the vicinity of the head slider 24. The sensor detects the small vibration of the head slider.

Figure 7:
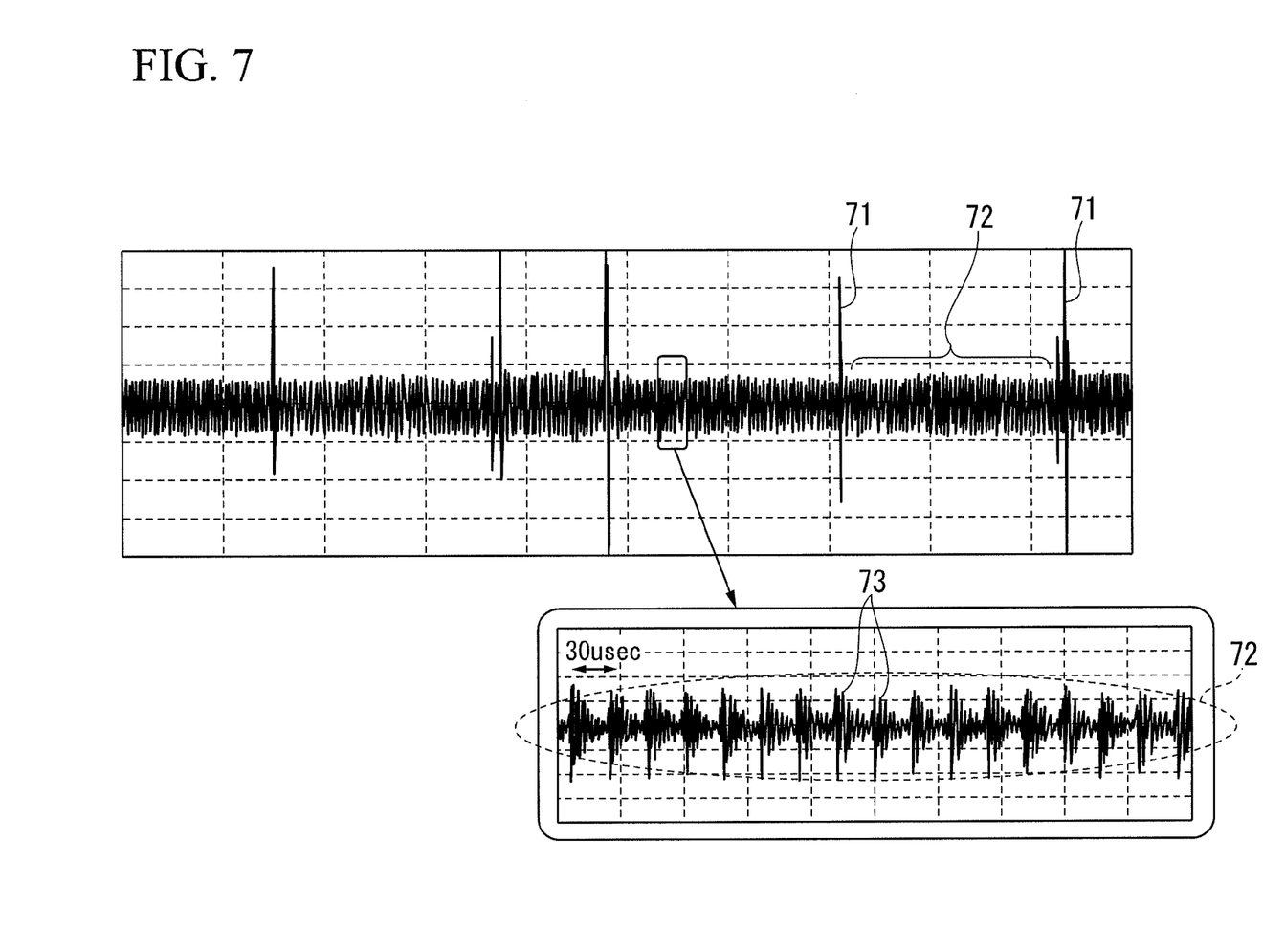
FIG. 7 shows the evaluation result obtained by a method of evaluating a magnetic recording medium according to an embodiment of the invention and is a waveform diagram illustrating an example of a signal output from a sensor.

FIG. 7 shows an example of the signal output from the sensor in the evaluation method according to the invention. In this example, FIG. 7 shows the signal output from a piezoelectric sensor when a magnetic recording medium with an outside diameter of 48 mm (1.89 inches) and a track pitch of 271 kPTI (94 nm pitch, a data region width of 54 nm, and a separation region width of 40 nm) is rotated at 6000 rpm and the head slider having the piezoelectric sensor attached thereto floats at a floating height of 10 nm at a radius position of 15.8 mm from the center of the magnetic recording medium. FIG. 7 is an enlarged view illustrating a portion of the signal output from the sensor. In FIG. 7, a signal 71 with a large amplitude is output from the sensor when the head slider comes into contact with the magnetic recording medium 30 and is used for general glide evaluation. The signals according to the invention include a signal 72 with a small amplitude, in addition to the signal 71 with a large amplitude. The signal 72 is output from the sensor when the head slider does not contact the magnetic recording medium 30. In some cases, the unevenness of the surface of the magnetic recording medium 30 is evaluated from the signal output from the sensor in the non-contact state between the head slider and the magnetic recording medium 30. In the evaluation method, a component with a long period included in the signal 72 with a small amplitude is evaluated, but the component is different from a signal component used in the invention.

The signal used in the invention is a short-period signal component output from the sensor in the non-contact state between the head slider and the magnetic recording medium 30, as shown in the enlarged view of FIG. 7. The signal 72 also includes a noise signal with a small amplitude. A periodic signal (in FIG. 7, a signal with a period of 30 µsec) included in the signal 72 is caused by the instability of the floating of the head slider. That is, for example, when a piezoelectric sensor is attached to the head slider and the floating of the head slider is unstable, the head slider is vibrated, the vibration of the head slider is detected, and a signal is output from the sensor. In particular, the magnetic recording medium 30 according to the invention has periodic magnetic recording patterns on the circumferential surface thereof, concave portions as the separation regions of the periodic magnetic recording patterns and convex portions as the magnetic recording regions are formed on the surface of the magnetic recording medium, and the convex and concave portions remain on the surface. Therefore, the floating of the head slider is periodically changed by the convex and concave portions of the magnetic recording patterns, which causes the vibration of the head slider, and the vibration of the head slider is detected by the sensor. Then, a periodic signal is output from the sensor.

In particular, in the invention, in the magnetic recording medium 30 in which the magnetic recording pattern includes the data region and the servo information region, it is preferable that a signal output when the head slider passes through a boundary portion between the data region and the servo information region of the magnetic recording pattern be used as the signal output from the sensor in the non-contact state between the head slider and the magnetic recording medium 30. The signal output when the head slider passes through a boundary portion between the data region and the servo information region of the magnetic recording pattern indicates a signal 73 with a large amplitude among the periodic output signals shown in the enlarged view of FIG. 7. That is, the concave and convex portions of the magnetic recording pattern 101 in the servo information region are irregular, but the concave and convex portions of the magnetic recording pattern 100 in the data region are regular. Therefore, when the magnetic head is moved from the servo information region to the data region and from the data region to the servo information region, the floating of the head is unstable. In particular, when the head slider is moved from the data region to the servo information region of the magnetic recording pattern, the signal 73 with a large amplitude is output.

As described above, even when the magnetic recording patterns 100 and 101 in the data region and the servo information region are optimized, a difference in the height of an uneven pattern and a difference in the height of, particularly, the edge of the uneven pattern occurs due to a small difference in the pattern formation conditions in the manufacturing process of the magnetic recording medium 30, and the head slider is greatly vibrated due to the change in the shape of the pattern. In this case, the head slider instantaneously contacts the magnetic recording medium 30. Therefore, when the head slider scans the surface of the magnetic recording medium 30 and the amplitude of the signal 73 shown in the enlarged view of FIG. 7 among the signals output from the sensor is equal to or more than a threshold value, the magnetic recording medium is determined to be defective and is excluded. In this way, it is possible to reliably discriminate the magnetic recording medium 30 that is likely to be defective when it is provided in a hard disk drive.

In the invention, it is preferable that a method of evaluating the magnetic recording medium 30 be incorporated as a total inspection item of the magnetic recording medium 30 into a process of manufacturing the magnetic recording medium 30. As described above, it is possible to reduce the instability of the floating of the head a little when the head slider is moved from the data region to the servo information region by optimizing the patterns 100 and 101 in the data region and the servo information region. Therefore, it is considered unnecessary to perform the evaluation method according to the invention on the entire magnetic recording medium 30 having the patterns 100 and 101. However, even when the patterns in the data region and the servo information region are optimized, a difference in the height of an uneven pattern and a difference in the height of, particularly, the edge of the uneven pattern occurs due to a little difference in the pattern formation conditions in the manufacturing process of the magnetic recording medium 30, and it is difficult to completely remove the instability. Therefore, it is preferable that the method of evaluating the magnetic recording medium 30 be incorporated as a total inspection item of the magnetic recording medium 30 into a process of manufacturing the magnetic recording medium 30.

A process of inspecting the magnetic recording medium 30 may be performed at the same time as a glide inspection evaluation process is performed. However, it is preferable that the inspection process be performed separately from the glide inspection evaluation process. As shown in FIG. 7, the signal 72 used in the evaluation method according to the invention may be output at the same time as the signal 71 used in the glide evaluation is output. The intensity of the signal 72 is about 1/10 to 1/100 of that of the signal 72. Therefore, it is preferable that the process of inspecting the magnetic recording medium 30 according to the invention be provided separately from the glide inspection evaluation process and be performed on the magnetic recording medium 30 passing the glide inspection evaluation process in order to improve the accuracy of the evaluation. The reason is that since the intensity of the signal 72 is about 1/10 to 1/100 of that of the signal 72, the sensitivity of the sensor required for an evaluation apparatus or the performance of an amplifier for amplifying the signal output from the sensor is different.

Next, a method of manufacturing the magnetic recording medium 30 will be described. In the description of the manufacturing method, a discrete-type magnetic recording medium 30 is used. However, a similar manufacturing method may be used for a bit-pattern-type magnetic recording medium.

In general, the magnetic recording medium 30 according to the invention has a structure in which a soft magnetic layer, an intermediate layer, magnetic regions and separation regions in which magnetic patterns are formed, and a protective layer are formed on the surface of a disk-shaped substrate, and a lubricating film is formed on the outermost surface. In addition, the magnetic regions, which are magnetic pattern regions, are separated by the separation regions.

Figure 4:
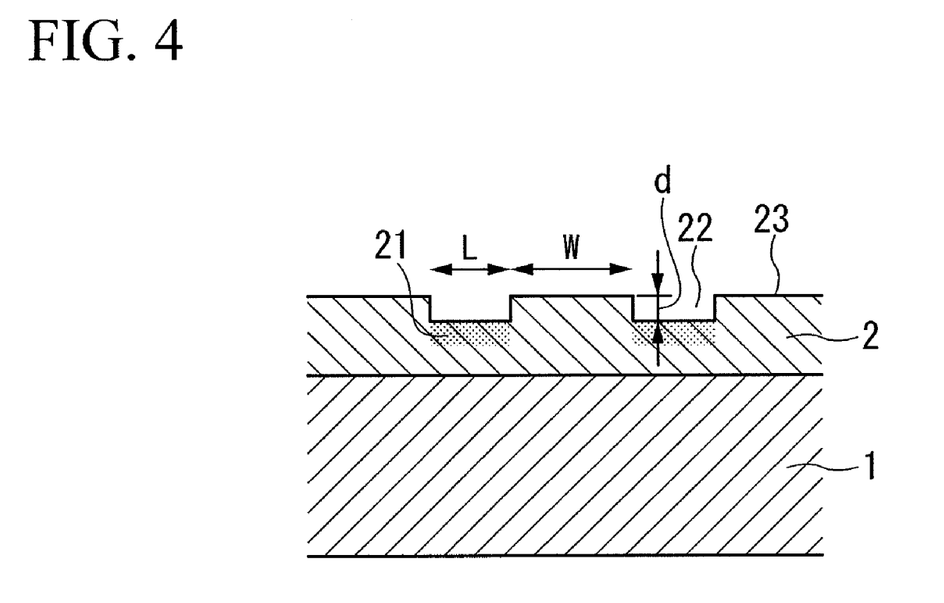
FIG. 4 is a cross-sectional view schematically illustrating the sectional structure of a substrate and a magnetic layer of a magnetic recording medium according to an embodiment of the invention.

FIG. 4 shows an embodiment of the magnetic recording medium 30 according to the invention, in which only the substrate and the magnetic layer are shown. In FIG. 4, reference numeral 1 indicates the disk-shaped substrate, and reference numeral 2 indicates the magnetic layer formed on the disk-shaped substrate. Concave portions 22 are formed in the magnetic layer 2 at predetermined points such that the outer surface portions of the magnetic layer 2 are removed. In addition, "d" indicates the depth of the concave portion. A region 21 whose magnetic characteristics are reduced by, for example, non-magnetization is provided below the concave portion. The magnetic layer 2 is separated by the regions 21 with low magnetic characteristics and the concave portions 22 and convex portions 23 are formed. In the invention, a non-magnetic region includes a region with low magnetic characteristics.

Next, a method of manufacturing the magnetic recording medium 30 shown in FIG. 4 will be described. The method of manufacturing the magnetic recording medium 30 includes processes shown in FIGS. 5(a) to 5(i).

Figure 5:
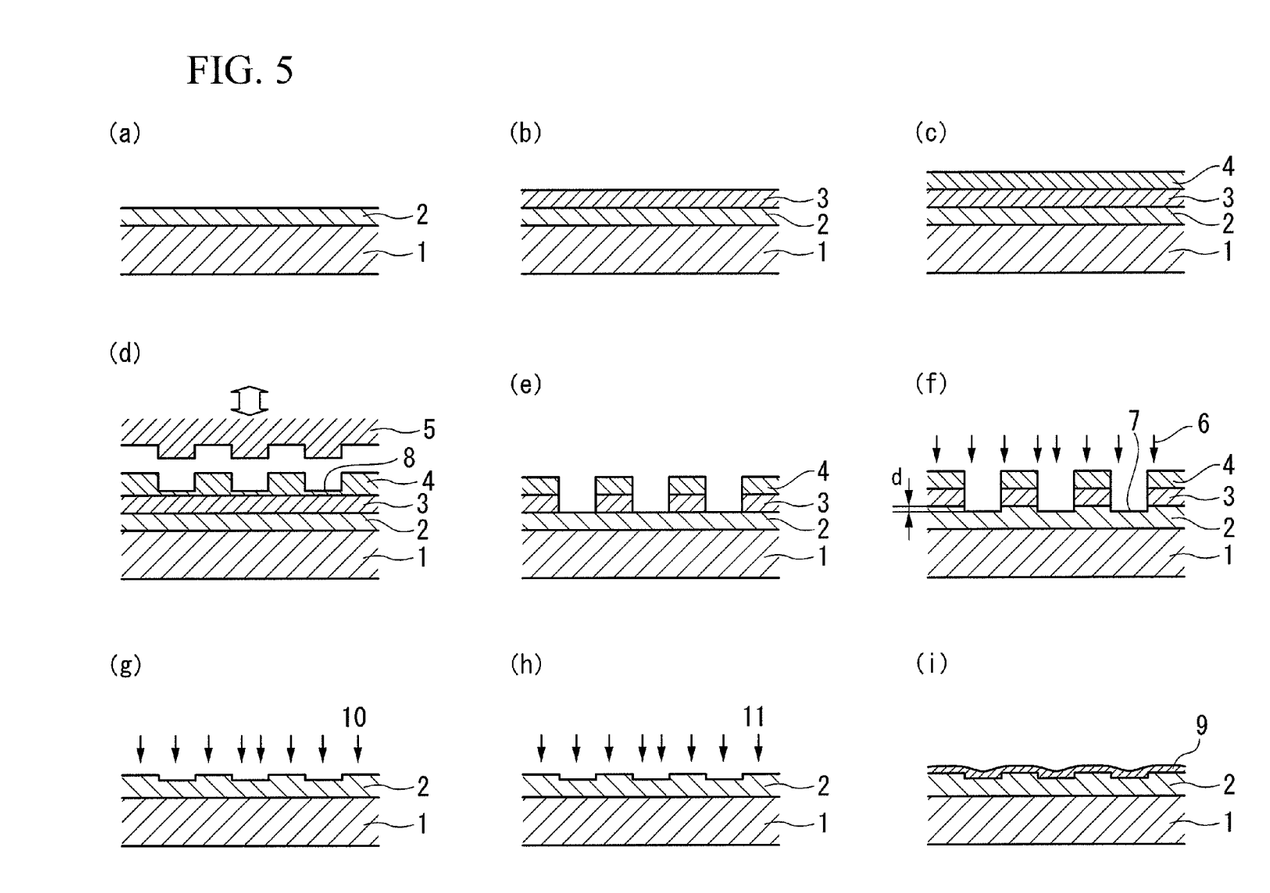
FIG. 5 is a cross-sectional view schematically illustrating an example of a manufacturing process in a method of manufacturing the magnetic recording medium according to the invention.

That is, in the process shown in FIG. 5(a), at least the magnetic layer 2 is formed on the disk-shaped substrate 1. Then, in the process shown in FIG. 5(b), a carbon mask layer 3 is formed on the magnetic layer 2. Then, in the process shown in FIG. 5(c), a resist layer 4 is formed on the carbon mask layer 3.

Then, in the process shown in FIG. 5(d), a negative pattern of the magnetic recording pattern is transferred to the resist layer 4 using a stamp 5. In the invention, the negative pattern means a pattern of the concave portions formed in the resist layer in correspondence with the recording tracks in order to separate the recording tracks. In this process, an arrow indicates the movement of the stamp 5. Reference numeral 8 indicates the resist layer that remains in the formation of the negative pattern.

Then, in the process shown in FIG. 5(e), a resist layer 8 remaining after the transfer process and a portion of the carbon mask layer 3 corresponding to the negative pattern of the magnetic recording pattern are removed. Then, in the process shown in FIG. 5(f), the outer surface of the magnetic layer 2 exposed by the removal of the carbon mask 3 is removed by ion milling 6, and a non-magnetic region is formed in the magnetic layer whose outer surface is removed. Reference numeral 7 indicates the removed portion. The process of forming the non-magnetic region is, for example, a process of exposing the magnetic layer to oxygen or ozone 10 or a process of emitting laser beams. Then, in the process shown in FIG. 5(g), the resist 4 and the carbon mask layer 3 are removed.

It is preferable that, before the non-magnetic region is formed in a portion of the magnetic layer 2 corresponding to the negative pattern of the magnetic recording pattern, the surface of the magnetic layer 2 be exposed to a fluorine-based gas in advance, in addition to the above-mentioned processes. In addition, as shown in FIG. 5(h), it is preferable that a process of radiating an inert gas 11, such as Ar, to slightly remove the outer surface of the magnetic layer 2 be performed after the process of removing the resist layer 4 and the carbon mask layer 3. Then, as shown in FIG. 5(i), it is preferable to perform a process of forming a protective layer 9 on the magnetic layer 2.

As the disk-shaped substrate 1 used in the invention, any substrate may be used as long as it has a disk shape. For example, any of the following substrates may be used: an Al alloy substrate made of, for example, an Al—Mg alloy including Al as a main component; and substrates made of general soda glass, aluminosilicate-based glass, crystallized glass-based silicon, titanium, ceramics, and various kinds of resins. Among them, it is preferable to use an Al alloy substrate, a glass substrate made of, for example, crystallized glass, or a silicon substrate. In addition, the average surface roughness (Ra) of these substrates is equal to or less than 1 nm is, preferably equal to or less than 0.5 nm, and more preferably is equal to or less than 0.1 nm.

The magnetic layer 2 formed on the surface of the disk-shaped substrate 1 may be an in-plane magnetic layer or a vertical magnetic layer. However, it is preferable that the magnetic layer 2 be a vertical magnetic layer in order to obtain a high recording density. It is preferable that the magnetic layer 2 be made of an alloy including Co as a main component.

For example, as the magnetic layer for an in-plane magnetic recording medium, a laminated structure of a non-magnetic CrMo base layer and a ferromagnetic CoCrPtTa magnetic layer may be used.

For example, a laminate of an under layer made of, for example, a soft magnetic FeCo alloy (for example, FeCoB, FeCoSiB, FeCoZr, FeCoZrB, or FeCoZrBCu), a FeTa alloy (for example, FeTaN or FeTaC), or a Co alloy (for example, CoTaZr, CoZrNB, or CoB), an alignment control film made of, for example, Pt, Pd, NiCr, or NiFeCr, an intermediate film made of, for example, Ru (which is optional), and a magnetic layer with a granular structure made of a 60Co-15Cr-15Pt alloy or a 70Co-5Cr-15Pt-10SiO$_2$ alloy may be used as the magnetic layer for a vertical magnetic recording medium.

In the invention, in particular, it is preferable to use a magnetic layer with a granular structure as the magnetic layer 2 in order to improve the reactivity when the non-magnetic region 21 is formed. The magnetic layer with the granular structure has a structure in which the periphery of a magnetic particle is covered with an oxide. For example, in addition to $SiO_2$, a Ti oxide, a W oxide, a Cr oxide, a Co oxide, a Ta oxide, or a Ru oxide may be used as the oxide.

The thickness of the magnetic layer 2 is equal to or more than 3 nm and equal to or less than 20 nm, and is preferably equal to or more than 5 nm and equal to or less than 15 nm. The magnetic layer 2 may be formed such that sufficient head output and input are obtained according to the kind of magnetic alloy used and the kind of laminated structure. The thickness of the magnetic layer 2 needs to be equal to or more than a predetermined value in order to obtain a predetermined output or more during reproduction. Since various kinds of parameters indicating the recording/reproduction characteristics generally deteriorate with an increase in the output, it is necessary to set the thickness of the magnetic layer to the optimal value. In general, the magnetic layer 2 is formed as a thin film by a sputtering method.

In the manufacturing method according to this embodiment, the carbon mask layer 3 is formed on the surface of the magnetic layer 2. Carbon is easily processed by dry etching (reactive ion etching or reactivity ion milling) using oxygen gas. Therefore, in the process shown in FIG. 5(g), the use of carbon makes it possible to reduce the residue and the contamination of the surface of the magnetic recording medium. The carbon film may be formed by a sputtering method or by a CVD method. However, it is preferable to use the CVD method in order to form a high-density carbon film.

The thickness of the carbon mask layer 3 is preferably in the range of 5 nm to 40 nm and is more preferably in the range of 10 nm to 30 nm. When the thickness of the carbon mask layer 3 is less than 5 nm, the edge of the mask layer 3 sags down and the formation characteristics of the magnetic recording pattern deteriorate. In addition, ions passing through the resist layer 4 and the carbon mask layer 3 are infiltrated into the magnetic layer 2, which results in the deterioration of the magnetic characteristics of the magnetic layer 2. On the other hand, when the thickness of the carbon mask layer 3 is more than 40 nm, the etching time of the carbon mask layer 3 increases, which results in low productivity. In addition, the residue when the carbon mask layer 3 is etched is likely to remain on the surface of the magnetic layer.

Then, the resist layer 4 is formed on the carbon mask layer 3 and the negative pattern of the magnetic recording pattern is formed in the resist layer 4. As a method of forming the negative pattern in the resist layer 4, a general photolithography technique may be used. However, it is preferable to use a method of transferring the negative pattern of the magnetic recording pattern onto the resist layer 4 using a stamp in terms of work efficiency.

In the manufacturing method according to this embodiment, as shown in FIG. 5(d), it is preferable that the thickness of the resist layer 8 remaining in the concave portion of the resist layer 4 after the negative pattern of the magnetic recording pattern is formed in the resist layer 4 be in the range of 0 nm to 20 nm. When the thickness of the resist layer 8 remaining in the concave portion of the resist layer 4 is within the above-mentioned range, in the process of etching the carbon mask layer 3 and the magnetic layer 2 shown in FIG. 5(e), it is possible to prevent the sagging of the edge of the carbon mask layer 3, improve the masking of the carbon mask layer 3 with respect to milling ions, and improve the formation characteristics of the magnetic recording pattern by the carbon mask layer 3.

In the manufacturing method according to this embodiment, in the process shown in FIG. 5(c), the resist layer 4 is made of a radiation-curable material. During the process of transferring the pattern onto the resist layer 4 using the stamp 5 or after the pattern transfer process, it is preferable that the resist layer 4 be exposed to radiation. When this manufacturing method is used, it is possible to accurately transfer the shape of the stamp 5 onto the resist layer 4. In the process of etching the carbon mask layer 3 shown in FIG. 5(e), it is possible to prevent the sagging of the edge of the carbon mask layer 3, improve the masking of the carbon mask layer 3 with respect to milling ions, and improve the formation characteristics of the magnetic recording pattern by the carbon mask layer 3. The radiation used in the invention is electromagnetic waves including heat rays, visible light, infrared rays, X-rays, and gamma rays in a wide concept. Examples of the radiation-curable material include a thermosetting resin for heat rays and an infrared-curable resin for infrared rays.

In the manufacturing method according to this embodiment, during the process of transferring the pattern onto the resist layer 4 using the stamp 5, the resist layer 4 is exposed to radiation so as to be cured with the fluidity of the resist layer 4 at a high level and the stamp being pressed against the resist layer 4, and the stamp is separated from the resist layer 4. In this way, it is possible to accurately transfer the shape of the stamp onto the resist layer 4. As the method of emitting radiation to the resist layer 4 with the stamp being pressed against the resist layer 4, any of the following methods may be used: a method of emitting radiation from the side opposite to the stamp, that is, from the substrate side; a method of selecting a material transmitting radiation as the material forming the stamp and emitting radiation from the stamp side; a method of emitting radiation from the side surface of the stamp; and a method of using radiation having high conductivity with respect to a solid, such as heat rays, and emitting radiation using heat transferred from the stamp material or the substrate. Among them, it is preferable that the resist layer 4 be made of an ultraviolet-curable resin, such as a novolak-based resin, an acrylic acid ester-based resin, or an alicyclic epoxy-based resin, and the stamp material be glass or resin having high transmittance with respect to ultraviolet rays.

In the manufacturing method according to this embodiment, in particular, it is preferable that the resist layer be made of a $SiO_2$-based resist. The $SiO_2$-based resist has high resistance to dry etching using oxygen gas. Therefore, when the negative pattern of the magnetic recording pattern is formed in the carbon mask layer 3 by ion milling, the use of the $SiO_2$-based resist makes it possible to reduce the blurring of an image. That is, the carbon mask layer 3 can be easily processed by dry etching using oxygen gas. Meanwhile, since the $SiO_2$-based resist has high resistance to dry etching using oxygen gas, it is possible to vertically etch the carbon mask layer 3 using dry etching and thus manufacture a sharp magnetic recording pattern.

The carbon mask layer 3 is removed. When the resist layer 8 remains in the concave portion after the negative pattern is formed, the resist layer 8 is removed as shown in FIG. 5(e) before the carbon mask layer 3 is removed. The carbon mask layer 3 and the resist layer 4 are removed by a dry etching method, such as a reactive ion etching method or an ion milling method.

In the invention, a process of demagnetizing a portion of the magnetic layer 2 that is not covered by the carbon mask layer 3 and the resist layer 4 is provided. However, before the process, a process of removing the non-covered portion of the magnetic layer 2 is performed as shown in FIG. 5(f). In this case, it is preferable that the outer surface (a portion with a thickness d in FIG. 5(f)) of the magnetic layer 2 be removed to a depth of 0.1 nm to 15 nm. In some cases, the outer surface of the magnetic layer 2 is altered by the carbon mask layer 3 formed thereon or the influence of air. When there is such an altered layer, in some cases, the non-magnetic reaction of the magnetic layer 2 does not occur effectively. The magnetic layer 2 is removed by performing ion milling or dry etching, such as reactive ion etching, on the carbon mask layer 3 and performing dry etching on the magnetic layer 2 using ion milling. The use of this method makes it possible to vertically form the edge of the remaining magnetic layer 2. The reason is that, since the carbon mask layer 3 on the magnetic layer 2 is vertically etched, the magnetic layer 2 below the carbon mask layer 3 is formed in the same shape as that of the carbon mask layer 3. The use of this process makes it possible to form the magnetic layer 2 with good fringe characteristics.

In the manufacturing method according to this embodiment, as described above, it is preferable to perform reactive ion etching using oxygen gas on the carbon mask layer 3. In addition, it is preferable to perform ion milling using an inert gas, such as argon or nitrogen, on the magnetic layer 2. That is, it is preferable to optimally change the milling ions for the carbon mask layer 3 and the milling ions for the magnetic layer.

It is preferable that, before the process of demagnetizing a portion of the magnetic layer 2 that is not covered with the carbon mask layer 3 and the resist layer 4, the surface of the magnetic layer 2 be exposed to a fluorine-based gas. According to this process, it is possible to improve the reactivity of the surface of the magnetic layer 2 and effectively achieve a non-magnetic reaction.

In the invention, as described above, it is preferable to use a magnetic layer with a granular structure as the magnetic layer 2. The magnetic layer with the granular structure is a magnetic layer having a structure in which the periphery of the magnetic particle is covered with an oxide. Since magnetic crystals are separated in a non-magnetic phase, the magnetic reaction between the magnetic particles is weak. In addition, since magnetic crystal particles are fine, it is possible to form a magnetic layer with a very small amount of noise. When the magnetic layer 2 is demagnetized with oxygen or ozone, it is possible to selectively etch an oxide layer disposed at the grain boundary with, for example, a reactive ion etching apparatus using a fluorine-based gas and accelerate the oxidation reaction between a metal material, such as Co, and oxygen or ozone in the magnetic layer 2. Therefore, it is possible to effectively change the magnetic characteristics of the magnetic layer 2.

In the invention, a two-layer structure including a granular structure and a non-granular structure on the granular structure may be used as the magnetic layer 2.

In the magnetic recording medium 30, it is preferable that the width W of the magnetic portion of the magnetic layer 2 having a magnetic pattern be equal to or less than 200 nm and the width L of the non-magnetic portion (separation region) be equal to or less than 100 nm in order to improve the recording density. Therefore, a track pitch P(=W+L) is as small as possible in the range of 300 nm or less in order to improve the recording density of the data region.

When the magnetic layer is separated as viewed from the surface of the magnetic recording medium 30, it is possible to achieve the object of the invention even though the magnetically separated magnetic recording patterns are not separated in the bottom of the magnetic layer. The magnetic recording patterns are included in the concept of the magnetically separated magnetic recording patterns according to the invention. In addition, the magnetic recording patterns according to the invention include, for example, a so-called bit pattern type in which the magnetic recording patterns are regularly arranged for one bit, a so-called discrete type in which the magnetic recording patterns are arranged in a track shape, the above-mentioned servo information signal pattern, and the above-mentioned burst signal pattern.

It is preferable that the invention be applied to a so-called discrete-type magnetic recording medium in which the magnetically separated magnetic recording pattern is a magnetic recording track and a servo signal pattern in order to simplify a manufacturing process.

When the magnetic recording medium 30 according to the invention is manufactured, a process of partially demagnetizing the magnetic layer 2 and removing the resist layer 4 and the carbon mask layer 3 formed on the magnetic layer 2 is provided. It is preferable to remove the resist layer 4 and the carbon mask layer 3 according to the invention using, for example, a dry etching method, a reactive ion etching method, or an ion milling method.

When the magnetic recording medium 30 according to the invention is manufactured, it is preferable to provide a process of etching the outer surface of the magnetic layer 2 to a depth of 1 nm to 2 nm with an inert gas, such as Ar, in order to remove the outermost surface layer demagnetized with, for example, ozone in the surface of the magnetic layer 2. This is because the surface of the magnetic layer 2 in the region is roughened in some cases.

In the invention, the protective layer 9 is formed on the surface of the magnetic layer 2 (the magnetic region and the region in which a non-magnetic material is buried or the region of the concave portion in which a non-magnetic material is not buried) after the resist layer 4 and the carbon mask layer 3 are removed. The protective layer 9 may be made of a carbon material, such as carbon (c), carbon hydride (H×C), carbon nitride (CN), amorphous carbon, or silicon carbide (SiC), or a general protective layer material, such as $SiO_2$, $Zr_2O_3$, or TiN. In addition, the protective layer 9 may include two or more layers.

The thickness of the protective layer 9 needs to be equal to or less than 10 nm. When the thickness of the protective layer 9 is more than 10 nm, the distance between the head and the magnetic layer 2 increases, and it is difficult to obtain adequate output/input signal intensity. In general, the protective layer 9 is formed by a sputtering method or a CVD method.

It is preferable to form a lubricating layer on the protective layer 9. For example, a fluorine-based lubricant, a carbon hydride-based lubricant, or a mixture thereof is given as an example of a lubricant used for the lubricating layer. In general, the lubricating layer is formed with a thickness of 1 nm to 4 nm.

Figure 6:
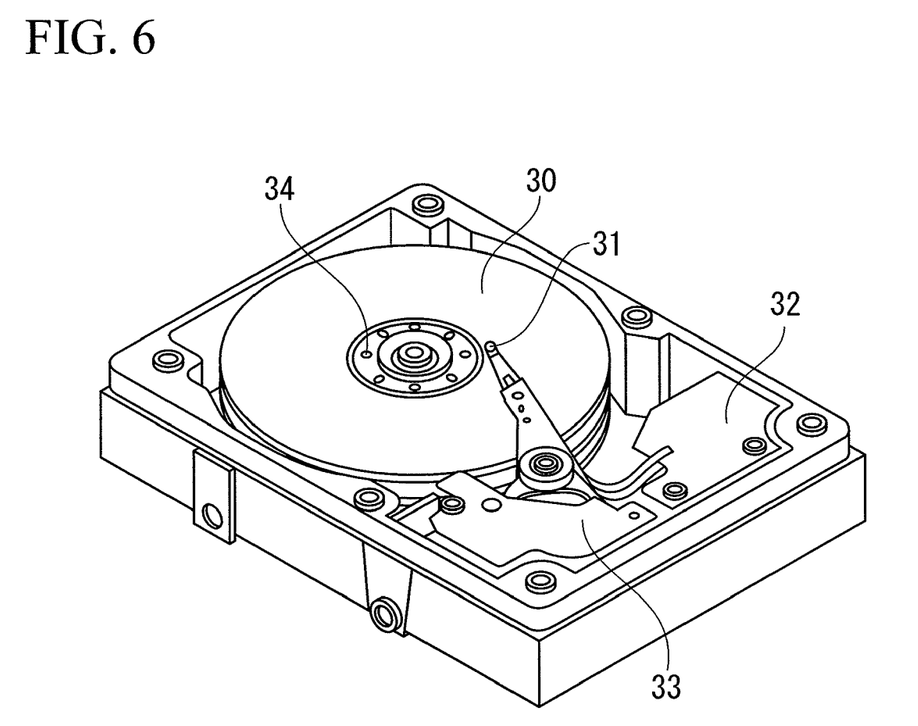
FIG. 6 is a perspective view schematically illustrating the structure of the magnetic recording/reproducing apparatus according to the invention.

FIG. 6 shows the structure of a magnetic recording/reproducing apparatus (hard disk drive) according to the invention. The magnetic recording/reproducing apparatus according to the invention includes the magnetic recording medium 30 according to the invention, a medium driving unit 34 that drives the magnetic recording medium 30 in a recording direction, a magnetic head 31 including a recording unit and a reproducing unit, a head driving unit 33 that moves the magnetic head 31 relative to the magnetic recording medium 30, and a recording/reproduction signal processing system 32 including a recording/reproduction signal processing unit that inputs a signal to the magnetic head 31 and reproduces a signal output from the magnetic head 31. The units may be combined to form a magnetic recording device with high recording density. In the related art, the width of the reproducing head is smaller than that of the recording head in order to exclude the influence of a magnetization transition region of the track edge. However, in the invention, it is possible to operate the reproducing head and the recording head having substantially the same width by magnetically discretely processing the recording track of the magnetic recording medium. In this way, it is possible to obtain a sufficient reproduction output and a high SNR.

In addition, it is possible to obtain sufficient signal intensity at high recording density and thus achieve a magnetic recording device with high recording density by forming the reproducing unit of the magnetic head 31 as a GMR head or a TMR head. When the magnetic head 31 floats and moves at a floating height of 0.005 μm to 0.020 μm, which is lower than that of the related art, the output is improved and a high SNR is obtained. Therefore, it is possible to provide a high-capacity and high-reliability magnetic recording device. When a signal processing circuit is combined by a maximum-likelihood decoding method, it is possible to further improve the recording density. For example, even when recording and reproduction are performed at a track density of 100 ktracks/inch or more, a line recording density of 1000 kbits/inch or more, and a recording density of 100 Gbit/square inch or more, a sufficient SNR is obtained.

EXAMPLES

Examples

A vacuum chamber having a glass substrate for HD set therein was evacuated at a pressure of $1.0 \times 10^{-5}$ Pa or less in advance. The glass substrate used in this example was made of crystallized glass including $Li_2Si_2O_5$, $Al_2O_3$—$K_2O$, $MgO$—$P_2O_5$, and $Sb_2O_3$—$ZnO$ as constituent components and had an outside diameter of 65 mm, an inside diameter of 20 mm, and an average surface roughness (Ra) of 2 Å.

A soft magnetic layer made of 60Fe30Co10B, an intermediate layer made of Ru, and a magnetic layer with a granular structure made of a 70Co-5Cr-15Pt-10SiO$_2$ alloy were sequentially formed on the glass substrate by a DC sputtering method and a carbon mask layer was formed thereon by a P-CVD method. The thickness of the 60Fe30Co10B soft magnetic layer was 60 nm, the thickness of the Ru intermediate layer was 10 nm, the thickness of the magnetic layer was 15 nm, and the thickness of the carbon mask layer was 30 nm. A SiO$_2$ resist was applied onto the carbon mask layer by a spin coat method. The thickness of the SiO$_2$ resist was 100 nm.

A glass stamp having a negative pattern of the magnetic recording pattern was pressed against the resist layer at a pressure of 1 MPa (about 8.8 kgf/cm$^2$). Then, the stamp was separated from the resist layer. In this way, the magnetic recording pattern was transferred to the resist layer. In the magnetic recording pattern transferred to the resist layer, the convex portion of the resist in the data region had a circular shape with a width of 54 nm and the gap between the convex portions of the resist was 40 nm. In this way, it was possible to form data regions that had a width of 54 nm and were arranged at a pitch of 94 nm and the separation regions with a width of 40 nm.

The servo information region with a width of 20 μm was formed between the data regions in the circumferential direction by a resist pattern. An uneven pattern in the servo information region was designed such that the area ratio of the convex portions in the servo information region was in the range of 40% to 60%. The thickness of the resist layer was 80 nm and the thickness of the concave portion (bottom) of the resist layer was about 5 nm. The angle of the concave portion of the resist layer with respect to the surface of the substrate was substantially 90 degrees.

First, the resist layer remaining in the concave portions was removed using CF$_4$ at a pressure of 0.5 Pa, a flow rate of 40 sccm, a plasma power of 200 W, and a bias of 20 W for an etching time of 10 seconds.

Then, at the positions where the concave portions of the resist layer were formed, the carbon mask layer was removed by dry etching and the outer surface of the magnetic layer was removed by ion etching. The dry etching was performed on the carbon mask layer under the conditions of an O$_2$ gas flow rate of 40 sccm, a pressure of 0.3 Pa, a high-frequency plasma power of 300 W, a DC bias of 30 W, and an etching time of 30 seconds.

In addition, the ion etching was performed on the magnetic layer under the conditions of a N$_2$ gas flow rate of 10 sccm, a pressure of 0.1 Pa, an acceleration voltage of 300 V, and an etching time of 5 seconds. The depth (d in FIG. 1) of the concave portion of the magnetic layer was about 1 nm.

Then, a portion of the magnetic layer that was not covered with the carbon mask layer was exposed to an ozone gas. The exposure of the magnetic layer to the ozone gas was performed under the following conditions: an ozone gas flow rate of 40 sccm in the chamber; a pressure of 1 Pa, an exposure time of 10 seconds; and a substrate temperature of 150° C.

Then, the carbon mask layer and the resist layer on the surface of the magnetic recording medium were removed by dry etching. Then, an ion milling apparatus was used to etch the surface of the magnetic layer to a depth of about 1 nm to 2 nm under the conditions of an Ar gas flow rate of 10 sccm, a pressure of 0.5 Pa, and an exposure time of 5 seconds, and a carbon protective film was formed with a thickness of 5 nm by a CVD method. Finally, a fluorine-based lubricating film was formed with a thickness of 2 nm. In this way, the manufacture of the magnetic recording medium was completed. The average height of the convex and concave portions corresponding to the magnetic recording pattern formed in the surface of the magnetic recording medium was 1 nm.

The glide inspection was performed on the magnetic recording medium manufactured by the above-mentioned method. In the glide inspection, the floating height of an inspection head (head slider) from the surface of the magnetic recording medium was set to 0.25 microinch (6.5 nm). When a signal caused by the collision between the inspection head and a protrusion on the surface of the magnetic recording medium was output from the inspection head, the magnetic recording medium was determined to be defective.

Evaluation of the Invention

The evaluation method according to the invention that detected the signal output from the sensor in the non-contact state between the head slider and the magnetic recording medium was performed on 10000 magnetic recording media passed the glide inspection process. AlTic with a size of 1.2 mm×0.8 mm was used as the head slider, a PZT sensor was attached to the head slider, and the signal output from the sensor was detected. The magnetic recording medium was rotated at 6000 rpm and the floating height of the head slider from the surface of the magnetic recording medium was set to 10 nm. Then, the head slider scanned the surface of the magnetic recording medium for 10 seconds and the maximum value of the output signal was examined. As a result, the maximum value of the output signal was in the range of 0 mV to 400 mV in 892 magnetic recording media, the maximum value of the output signal was in the range of 401 mV to 450 mV in 74 magnetic recording media, the maximum value of the output signal was in the range of 451 mV to 500 mV in 23 magnetic recording media, and the maximum value of the output signal was equal to or more than 501 mV in 11 magnetic recording media.

(Seek Evaluation of Magnetic Recording Medium)

In the evaluation, seek evaluation was performed on the magnetic recording medium with an output signal of 401 mV or more from the sensor. The number of revolutions of the magnetic recording medium was 4200 rpm, an MR head manufactured by TDK Corporation was used, and a head loading/unloading operation was repeatedly performed at a rate of 10 times per second for 72 hours in an environment of 60° and 80%. After the operation, the magnetic head and the surface of the magnetic recording medium were observed by an optical microscope and a scanning electron microscope to check for damage of the surface. As a result, in the evaluation, the surface of the magnetic head was contaminated or a surface damage was observed in no magnetic recording medium in which the maximum value of the output signal from the sensor was in the range of 401 mV to 450 mV, five magnetic recording media in which the maximum value of the output signal from the sensor was in the range of 451 mV to 500 mV, and eight magnetic recording media in which the maximum value of the output signal from the sensor was equal to or more than 501 mV. The above-mentioned result proved that this example could provide a magnetic recording medium with stable head floating characteristics by setting a threshold value for determining whether the magnetic recording medium was defective in the evaluation of the invention to the range of 401 mV to 450 mV.

Industrial Applicability

According to the invention, it is possible to ensure the floating stability of a head and thus reduce the floating height of the head in a magnetic recording medium having an uneven magnetic recording pattern on the surface thereof. Therefore, the invention has high industrial applicability capable of providing a hard disk drive with a low failure rate and high recording density characteristics.

EXPLANATION OF REFERENCE

1: DISK-SHAPED SUBSTRATE
2: MAGNETIC LAYER
3: CARBON MASK LAYER
4: RESIST LAYER
5: STAMP
7: PORTION PARTIALLY REMOVED FROM MAGNETIC LAYER
8: RESIST LAYER REMAINING AFTER TRANSFER
9: PROTECTIVE LAYER
20: HEAD GIMBAL ASSEMBLY
21: SEPARATION REGION
22: CONCAVE PORTION
23: CONVEX PORTION
24: HEAD SLIDER
25: SIGNAL LINE
26: MAGNETIC HEAD
27: SUSPENSION ARM
30: MAGNETIC RECORDING MEDIUM
31: MAGNETIC HEAD
32: RECORDING REPRODUCTION SIGNAL SYSTEM
33: HEAD DRIVING UNIT
34: MEDIUM DRIVING UNIT
100: MAGNETIC RECORDING PATTERN IN DATA REGION
101: MAGNETIC RECORDING PATTERN IN SERVO REGION
102: MOVEMENT DIRECTION OF HEAD
d: REMOVAL DEPTH OF MAGNETIC LAYER
L: WIDTH OF NON-MAGNETIC PORTION OF MAGNETIC RECORDING PATTERN
W: WIDTH OF MAGNETIC PORTION OF MAGNETIC RECORDING PATTERN

The invention claimed is:

1. A method of evaluating a magnetic recording medium having a magnetic recording pattern including a data region and a servo information region on at least one surface of a disk-shaped substrate and including concave and convex portions corresponding to the magnetic recording pattern on the surface, comprising:
    floating and moving a head slider having a sensor attached thereto above the surface of the magnetic recording medium that is rotated;
    detecting a variation in signal output from the sensor caused by the concave and convex portions in a non-contact state between the head slider and the magnetic recording medium as the head slider passes through a boundary portion between the data region and the servo information region, said signal output having an amplitude; and
    determining that the magnetic recording medium is defective when the amplitude of the signal output exceeds a predetermined maximum value.

2. The method of evaluating a magnetic recording medium according to claim 1,
    wherein the signal output from the sensor in the non-contact state between the head slider and the magnetic recording medium is caused by the instability of the floating of the head slider.

3. The method of evaluating a magnetic recording medium according to claim 1,
    wherein the sensor attached to the head slider is a piezoelectric sensor, and
    the detected signal is caused by the vibration of the head slider.

4. A method of manufacturing a magnetic recording medium having a magnetic recording pattern on at least one surface of a disk-shaped substrate and includes concave and convex portions corresponding to the magnetic recording pattern on the surface, comprising:
    the evaluation method according to claim 1 as a step of inspecting the magnetic recording medium.

5. The method of manufacturing a magnetic recording medium according to claim 4, wherein the step of inspecting the magnetic recording medium includes glide inspection evaluation.

* * * * *